(12) United States Patent
Park et al.

(10) Patent No.: US 8,841,194 B2
(45) Date of Patent: Sep. 23, 2014

(54) METHOD OF FORMING POLYSILICON LAYER AND METHOD OF MANUFACTURING THIN FILM TRANSISTOR USING THE POLYSILICON LAYER

(75) Inventors: Jong-Ryuk Park, Yongin (KR); Yun-Mo Chung, Yongin (KR); Tak-Young Lee, Yongin (KR); Kil-Won Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 296 days.

(21) Appl. No.: 13/485,684

(22) Filed: May 31, 2012

(65) Prior Publication Data

US 2013/0143378 A1 Jun. 6, 2013

(30) Foreign Application Priority Data

Dec. 2, 2011 (KR) ........................ 10-2011-0128525

(51) Int. Cl.
*H01L 21/336* (2006.01)
*H01L 21/20* (2006.01)

(52) U.S. Cl.
USPC 438/308; 438/486; 257/E21.09; 257/E21.411

(58) Field of Classification Search
None
See application file for complete search history.

(56) References Cited

U.S. PATENT DOCUMENTS

| 6,607,947 | B1 | 8/2003 | Zhang et al. |
| 6,936,551 | B2 * | 8/2005 | Moghadam et al. .......... 438/780 |
| 2002/0182828 | A1 | 12/2002 | Asami et al. |
| 2003/0162333 | A1 | 8/2003 | Kim et al. |

FOREIGN PATENT DOCUMENTS

| JP | 8-274345 A | 10/1996 |
| JP | 2003-173969 A | 6/2003 |
| JP | 2004-022900 A | 1/2004 |
| KR | 10-2003-0057655 A | 7/2003 |
| KR | 10-2005-0055357 A | 6/2005 |
| KR | 10-2008-0001497 A | 1/2008 |

* cited by examiner

*Primary Examiner* — Seahvosh Nikmanesh
(74) *Attorney, Agent, or Firm* — Knobbe Martens Olson & Bear LLP

(57) ABSTRACT

In one aspect, a method of forming a polysilicon (poly-Si) layer and a method of manufacturing a thin film transistor (TFT) using the poly-Si layer is provided. In one aspect, the method of forming a polysilicon (poly-Si) layer includes forming an amorphous silicon (a-Si) layer on a substrate in a chamber; cleaning the chamber; removing fluorine (F) generated while cleaning the chamber; forming a metal catalyst layer for crystallization, on the a-Si layer; and crystallizing the a-Si layer into a poly-Si layer by performing a thermal processing operation.

34 Claims, 7 Drawing Sheets

METHOD OF FORMING POLYSILICON LAYER AND METHOD OF MANUFACTURING THIN FILM TRANSISTOR USING THE POLYSILICON LAYER

CROSS-REFERENCE TO RELATED APPLICATION

This application claims priority to and the benefit of Korean Patent Application No. 10-2011-0128525, filed in the Korean Intellectual Property Office on Dec. 2, 2011, the disclosure of which is incorporated herein by reference in its entirety.

BACKGROUND

1. Field

The described technology generally relates to a method of forming a polysilicon (poly-Si) layer and a method of manufacturing a thin film transistor (TFT) using the poly-Si layer.

2. Description of the Related Technology

A thin film transistor (TFT) is a particular field effect transistor (FET) including a semiconductor thin film formed on an insulating supporting substrate. TFTs, like FETs, have three terminals such as a gate, a drain, and a source, and are mainly used for a switching operation. TFTs are used in sensors, memory devices, and optical devices, and are mainly used as pixel switching devices or driving devices in flat panel display apparatuses.

Products such as notebook computers, monitors, televisions (TVs), and mobile devices mostly use amorphous silicon (a-Si) TFTs. Amorphous silicon (a-Si) is silicon (Si) of which atoms are not regularly aligned as in crystals and which has short-range order and does not have long-range order. Amorphous silicon (a-Si) is the most common type of silicon used in TFTs. However, due to demands for large, high-quality, and high-performance display devices, a technology of manufacturing a high-performance TFT having higher electron mobility than an a-Si TFT having an electron mobility of 0.5 to 1 $cm^2/Vs$ is desired.

A polysilicon (poly-Si) TFT can have higher performance than a conventional a-Si TFT.

SUMMARY

One aspect of the present embodiments is a method of forming a polysilicon (poly-Si) layer having uniform crystallinity by removing fluorine (F) in a chamber, and a method of manufacturing a thin film transistor (TFT) using the poly-Si layer.

Another aspect of the present embodiments is a method of forming a polysilicon (poly-Si) layer, the method including forming an amorphous silicon (a-Si) layer on a substrate in a chamber; removing fluorine (F) in the chamber; forming a metal catalyst layer for crystallization, on the a-Si layer; and crystallizing the a-Si layer into a poly-Si layer by performing a thermal processing operation.

Another aspect of the present embodiments is a method of forming a polysilicon (poly-Si) layer, the method including forming an amorphous silicon (a-Si) layer on a substrate in a chamber; cleaning the chamber; removing fluorine (F) generated while cleaning the chamber; forming a metal catalyst layer for crystallization on the a-Si layer; and crystallizing the a-Si layer into a poly-Si layer by performing a thermal processing operation.

In certain embodiments, the cleaning of the chamber may include cleaning the chamber by supplying an F-based cleaning gas into the chamber.

In certain embodiments, the F-based cleaning gas may be a $NF_3$ gas.

In certain embodiments, the removing of F may include removing F by processing the chamber with hydrogen (H) plasma, after cleaning the chamber.

In certain embodiments, the removing of F may include removing F by processing a surface of the a-Si layer with H plasma, after cleaning the chamber.

In certain embodiments, the method may further include purging a residual gas or a by-product from the chamber by using an argon (Ar) gas, after forming the a-Si layer.

In certain embodiments, the method may further include forming a buffer layer on the substrate, before forming the a-Si layer.

In certain embodiments, the method may further include cleaning the chamber by supplying an F-based cleaning gas into the chamber, after forming the buffer layer.

In certain embodiments, the F-based cleaning gas may be a $NF_3$ gas.

In certain embodiments, the method may further include removing F generated while cleaning the chamber, after cleaning the chamber and before forming the a-Si layer.

In certain embodiments, the removing of F may include removing F by processing the chamber with H plasma, after cleaning the chamber.

In certain embodiments, the removing of F may include removing F by processing a surface of the buffer layer with H plasma, after cleaning the chamber.

In certain embodiments, the method may further include purging a residual gas or a by-product from the chamber by using an Ar gas, after forming the buffer layer.

In certain embodiments, the buffer layer may include silicon (Si) oxide, Si nitride, or Si oxynitride.

In certain embodiments, the metal catalyst layer may be selected from the group consisting of nickel (Ni), palladium (Pd), titanium (Ti), silver (Ag), aluminum (Al), tin (Sn), antimony (Sb), copper (Cu), cobalt (Co), molybdenum (Mo), terbium (Tb), ruthenium (Ru), rhodium (Rh), cadmium (Cd), and platinum (Pt).

In certain embodiments, the forming of the metal catalyst layer may include forming a capping layer on the a-Si layer; and forming the metal catalyst layer on the capping layer.

In certain embodiments, the forming of the metal catalyst layer may include forming a thermal oxidation layer on the a-Si layer; and forming the metal catalyst layer on the thermal oxidation layer.

Another aspect of the present embodiments is a method of manufacturing a thin film transistor (TFT), the method including forming an amorphous silicon (a-Si) layer on a substrate in a chamber; cleaning the chamber; removing fluorine (F) generated while cleaning the chamber; forming a metal catalyst layer for crystallization, on the a-Si layer; crystallizing the a-Si layer into a polysilicon (poly-Si) layer by performing a thermal processing operation; patterning the poly-Si layer into a semiconductor layer having a predetermined shape; forming a gate insulating layer to cover the semiconductor layer; forming a gate electrode on the gate insulating layer so as to correspond to a channel region of the semiconductor layer; forming an interlayer insulating layer on the gate insulating layer so as to cover the gate electrode; and forming source and drain electrodes on the interlayer insulating layer so as to be respectively electrically connected to source and drain regions of the semiconductor layer.

In certain embodiments, the cleaning of the chamber may include cleaning the chamber by supplying an F-based cleaning gas into the chamber.

In certain embodiments, the F-based cleaning gas may be $NF_3$ gas.

In certain embodiments, the removing of F may include removing F by processing the chamber with hydrogen (H) plasma, after cleaning the chamber.

In certain embodiments, the removing of F may include removing F by processing a surface of the a-Si layer with H plasma, after cleaning the chamber.

In certain embodiments, the method may further include purging a residual gas or a by-product from the chamber by using an argon (Ar) gas, after forming the a-Si layer.

In certain embodiments, the method may further include forming a buffer layer on the substrate, before forming the a-Si layer.

In certain embodiments, the method may further include cleaning the chamber by supplying an F-based cleaning gas into the chamber, after forming the buffer layer.

In certain embodiments, the F-based cleaning gas may be $NF_3$ gas.

In certain embodiments, the method may further include removing F generated while cleaning the chamber, after cleaning the chamber and before forming the a-Si layer.

In certain embodiments, the removing of F may include removing F by processing the chamber with H plasma, after cleaning the chamber.

In certain embodiments, the removing of F may include removing F by processing a surface of the buffer layer with H plasma, after cleaning the chamber.

In certain embodiments, the method may further include purging a residual gas or a by-product from the chamber by using an Ar gas, after forming the buffer layer.

In certain embodiments, the buffer layer may include silicon (Si) oxide, Si nitride, or Si oxynitride.

In certain embodiments, the metal catalyst layer may be selected from the group consisting of nickel (Ni), palladium (Pd), titanium (Ti), silver (Ag), aluminum (Al), tin (Sn), antimony (Sb), copper (Cu), cobalt (Co), molybdenum (Mo), terbium (Tb), ruthenium (Ru), rhodium (Rh), cadmium (Cd), and platinum (Pt).

In certain embodiments, the forming of the metal catalyst layer may include forming a capping layer on the a-Si layer; and forming the metal catalyst layer on the capping layer.

In certain embodiments, the forming of the metal catalyst layer may include forming a thermal oxidation layer on the a-Si layer; and forming the metal catalyst layer on the thermal oxidation layer.

DETAILED DESCRIPTION

Embodiments will be described in detail by explaining exemplary embodiments with reference to the attached drawings where like references numbers indicate identical or functionally similar elements. As used herein, the term "and/or" includes any and all combinations of one or more of the associated listed items.

FIGS. 1 through 9 are cross-sectional views depicting certain steps of a method of forming a polysilicon (poly-Si) layer by using a super grain silicon (SGS) crystallization operation, according to an example of the present embodiments.

Figure 1:
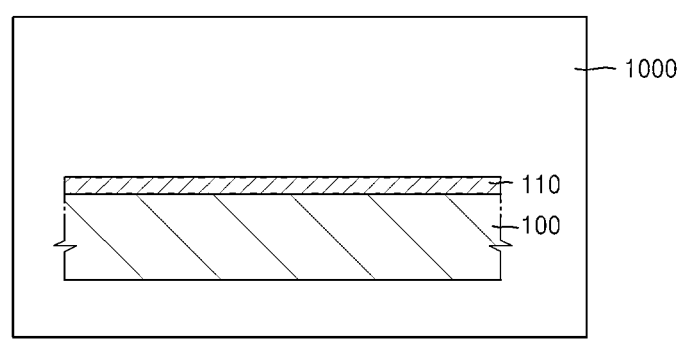
FIGS. 1 through 9 are cross-sectional views depicting certain steps of a method of forming a polysilicon (poly-Si) layer by using a super grain silicon (SGS) crystallization operation, according to a present embodiment.

Referring to FIG. 1, a buffer layer 110 is formed on a substrate 100.

In certain embodiments, the substrate 100 may be formed of, but is not limited to, a transparent glass material including $SiO_2$ as the main component.

In certain embodiments, the buffer layer 110 prevents penetration of impure elements into the substrate 100, planarizes the surface of the substrate 100, and may include silicon (Si) nitride or Si oxynitride.

Figure 2:
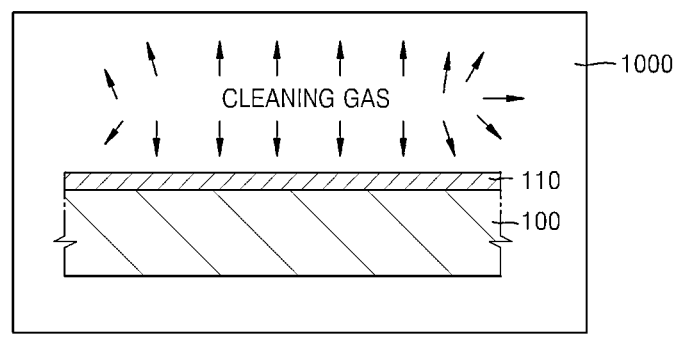

Referring to FIG. 2, a chamber 1000 includes a fluorine (F)-based cleaning gas. In certain embodiments, the fluorine (F)-based cleaning gas can clean the chamber. In certain embodiments, the buffer layer 110 can be formed by using a chemical vapor deposition (CVD) operation. In certain embodiments, when the buffer layer 110 is formed on the substrate 100, particles including the material of the buffer layer 110 may be deposited on inner walls of the chamber 1000. In certain embodiments, the particles in the chamber 1000 can be removed by injecting the F-based cleaning gas into the chamber 1000. The F-based cleaning gas may be a $NF_3$ gas including chlorine (Cl) and F.

Figure 3:
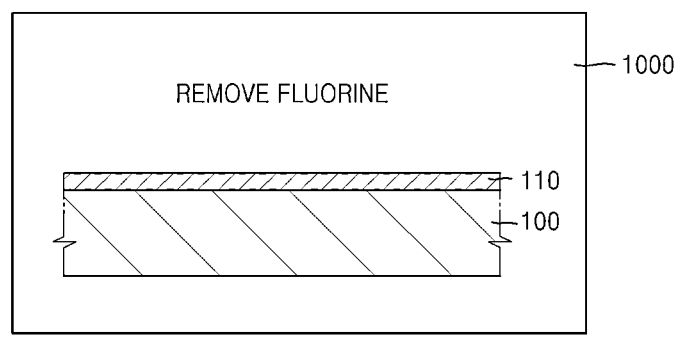

Referring to FIG. 3, F is removed from chamber 1000. In certain embodiments, the F may exist on the buffer layer 110 as well as in the chamber 1000. If F exists on the surface of the buffer layer 110, in an operation of forming a metal catalyst layer 140 (see FIG. 7), metal may be combined with F and may not be easily combined with Si such that crystallization may not be performed uniformly. Therefore, according to an aspect of the present embodiments, F in the chamber 1000 can be removed before the metal catalyst layer 140 is formed. In certain embodiments, after the chamber 1000 is cleaned by using the F-based cleaning gas, the chamber 1000 is processed with hydrogen (H) plasma so as to remove F on the surface of the buffer layer 110 and in the chamber 1000.

According to another embodiment, F in the chamber 1000 may be removed by using an argon (Ar) purge operation. The Ar purge operation is an operation of purging a residual gas or a by-product such as F from the chamber 1000 by using an Ar gas.

Figure 4:
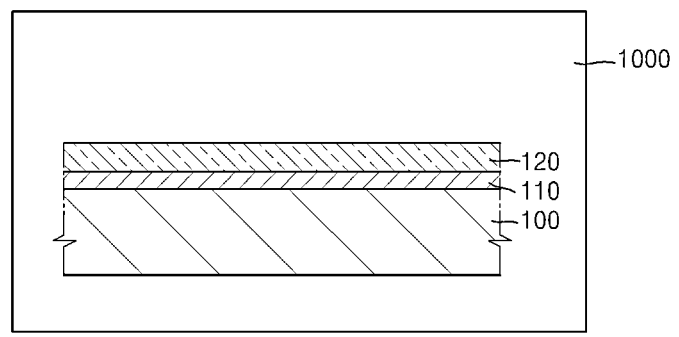

Referring to FIG. 4, an amorphous silicon (a-Si) layer 120 is formed on the buffer layer 110. In certain embodiments, the a-Si layer 120 may contain a gas such as $H_2$ as a by-product of a CVD operation. In certain embodiments, a dehydrogenation operation may be performed such that $H_2$ does not remain in the a-Si layer 120. However, the dehydrogenation operation is optional and may be omitted. According to another embodiment, the a-Si layer 120 may be formed directly on the substrate 100 without forming the buffer layer 110.

Figure 5:
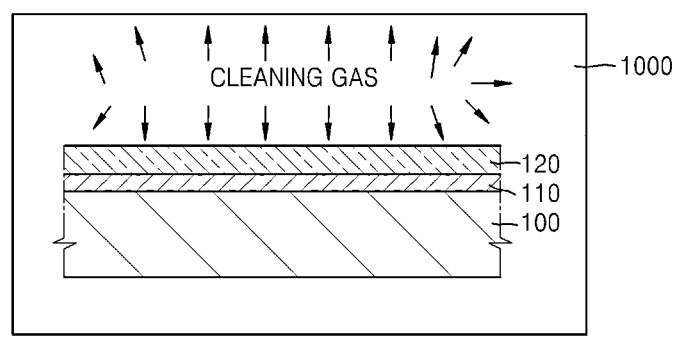

Referring to FIG. 5, the chamber 1000 includes an F-based cleaning gas. In certain embodiments, the chamber 1000 is cleaned by using an F-based cleaning gas. In certain embodiments, the material of the a-Si layer 120 may be deposited on inner walls of the chamber 1000. For example, a CVD operation can cause the material of the a-Si layer 120 to be deposited on inner walls of the chamber 1000. In certain embodiments, the particles in the chamber 1000 can be removed by injecting the F-based cleaning gas into the chamber 1000. In certain embodiments, the F-based cleaning gas may be a $NF_3$ gas including Cl and F.

Figure 6:
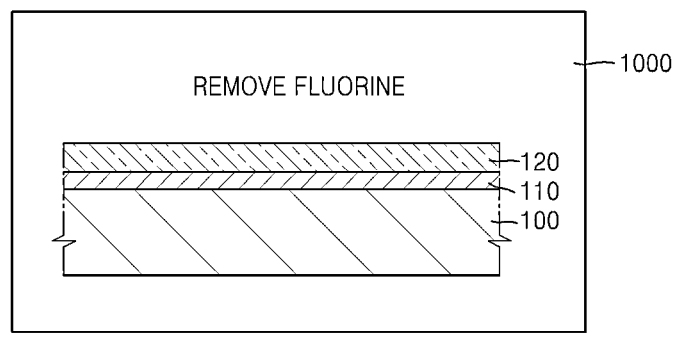

Referring to FIG. 6, F is removed from chamber 1000. In certain embodiments, the F may exist on the a-Si layer 120 as well as in the chamber 1000. If F exists on the surface of the a-Si layer 120, in an operation of forming the metal catalyst layer 140, metal may be combined with F and may not be easily combined with Si such that crystallization may not be performed uniformly. Therefore, according to an aspect of the present embodiments, F in the chamber 1000 is removed before the metal catalyst layer 140 is formed. In certain embodiments, the chamber 1000 is processed with H plasma so as to remove F on the surface of the a-Si layer 120 and in the chamber 1000 after the chamber 1000 is cleaned by using the F-based cleaning gas. According to another embodiment, F in the chamber 1000 may be removed by using an Ar purge operation. In certain embodiments, the Ar purge operation can be an operation of purging a residual gas or a by-product such as F from the chamber 1000 by using an Ar gas.

Figure 7:
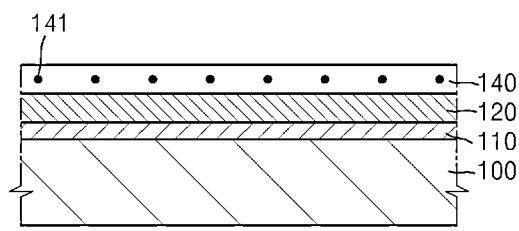

Referring to FIG. 7, the metal catalyst layer 140 including a metal catalyst 141 is formed on the a-Si layer 120. In certain embodiments, the metal catalyst 141 may be injected onto the a-Si layer 120 by using an atomic layer deposition (ALD) operation capable of ensuring a uniform atomic-level deposition thickness on the a-Si layer 120, or may be directly injected onto the a-Si layer 120 by sputtering the metal catalyst 141 as a target.

In certain embodiments, the metal catalyst 141 may have a surface density of $10^{11}$ to $10^{15}$ atoms/cm². If the surface density of the metal catalyst 141 is less than $10^{11}$ atoms/cm², crystallization may not be sufficiently performed. If the surface density of the metal catalyst 141 is greater than $10^{15}$ atoms/cm², metal-induced crystallization (MIC) may be performed and thus the amount of the remaining metal catalyst 141 may be large.

In certain embodiments, the metal catalyst 141 may be selected from the group consisting of nickel (Ni), palladium (Pd), titanium (Ti), silver (Ag), aluminum (Al), tin (Sn), antimony (Sb), copper (Cu), cobalt (Co), molybdenum (Mo), terbium (Tb), ruthenium (Ru), rhodium (Rh), cadmium (Cd), and platinum (Pt), and more particularly, Ni. In certain embodiments, Ni is used as the metal catalyst 141.

Figure 8:
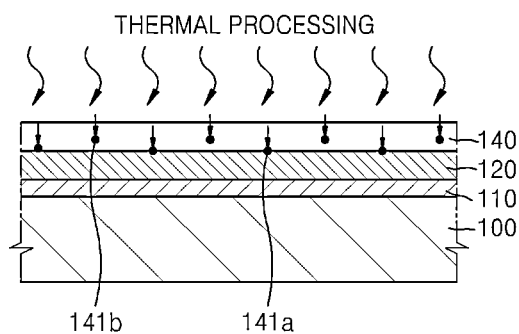
Figure 9:
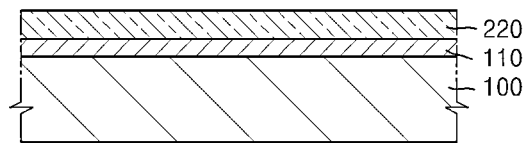

Referring to FIGS. 8 and 9, the a-Si layer 120 can be crystallized into a poly-Si layer 220 by thermally processing the metal catalyst layer 140.

In certain embodiments, a partial metal catalyst 141a passes through the metal catalyst layer 140 and is diffused to the a-Si layer 120 and the other partial metal catalyst 141b does not pass through the metal catalyst layer 140 and remains in the metal catalyst layer 140.

In certain embodiments, the partial metal catalyst 141a can be combined with Si of the a-Si layer 120 so as to form metal silicide, the metal silicide forms seeds for crystallization, and thus the a-Si layer 120 is crystallized into the poly-Si layer 220.

In certain embodiments, the thermal processing operation may be performed by using any one of a furnace process, a rapid thermal annealing (RTA) process, an ultraviolet (UV) process, and a laser process.

In certain embodiments, the thermal processing operation may be performed in two steps. In certain embodiments, the metal catalyst 141 of the metal catalyst layer 140 moves toward an interface of the a-Si layer 120 and forms seeds in the first thermal processing operation, and the a-Si layer 120 can be crystallized into the poly-Si layer 220 due to the seeds in the second thermal processing operation. In certain embodiments, the first thermal processing operation may be performed at 200° C. to 800° C., and the second thermal processing operation may be performed at 400° C. to 1300° C.

In certain embodiments, after crystallization, the metal catalyst layer 140 can be removed.

According to another embodiment, after the a-Si layer 120 is formed, a thermal oxidation layer (not shown) may be formed on the a-Si layer 120. In certain embodiments, the thermal oxidation layer can be formed by thermally oxidizing the a-Si layer 120. The thermal oxidation layer can control the density of the metal catalyst 141 diffused to the a-Si layer 120 and functions as a conventional capping layer (not shown). In certain embodiments, the thermal oxidation layer may allow the metal catalyst 141 to be uniformly diffused.

Although the density of the metal catalyst 141 can be controlled by using the thermal oxidation layer in certain embodiment, the present embodiments are not limited thereto. In certain embodiments, instead of the thermal oxidation layer, a conventional capping layer formed of Si nitride may be used.

In certain embodiments, the metal catalyst 141 may be directly formed on the a-Si layer 120 at a desired density without forming the thermal oxidation layer or the capping layer.

Figure 10:
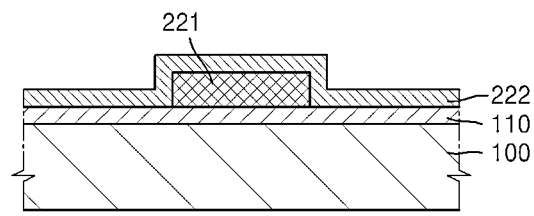
FIGS. 10 through 12 are cross-sectional views depicting certain steps of a method of manufacturing a thin film transistor (TFT) by using a SGS crystallization operation, according to an example of the present embodiments.
Figure 11:
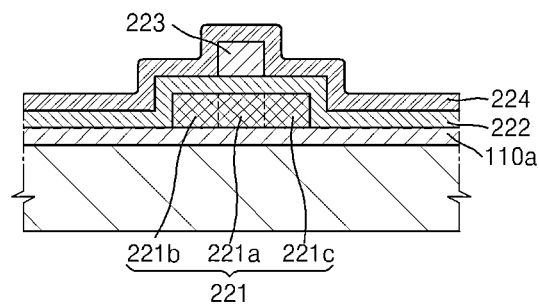
Figure 12:
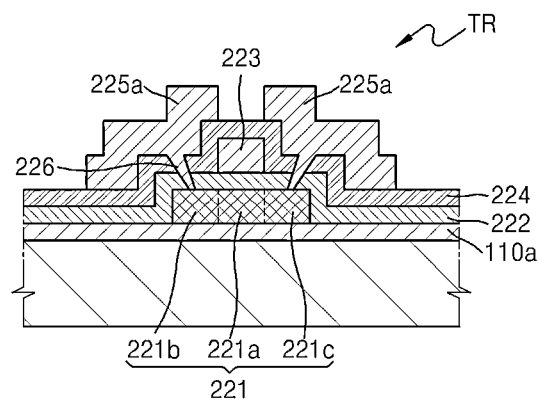
Figure 13:
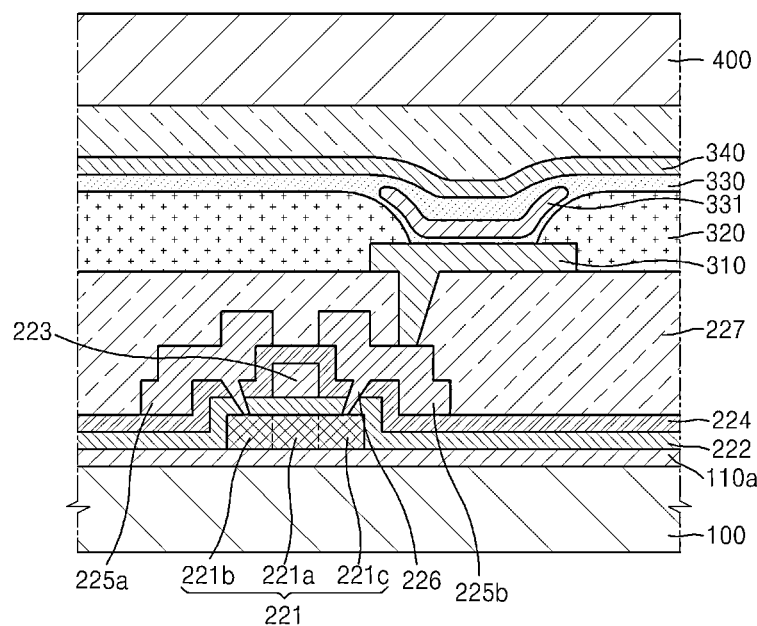
FIG. 13 is a cross-sectional view of an organic light emitting display apparatus including the TFT illustrated in FIG. 12, according to an example of the present embodiments.

FIGS. 10 through 12 are cross-sectional views depicting a method of manufacturing a thin film transistor (TFT) TR by using a SGS crystallization operation, according to an aspect of the present embodiments. FIG. 13 is a cross-sectional view of an organic light emitting display apparatus including the TFT TR illustrated in FIG. 12, according to an aspect of the present embodiments.

Referring to FIG. 10, a semiconductor layer 221 having a predetermined shape is depicted. In certain embodiments, the semiconductor layer 221 may be formed by patterning the poly-Si layer 220 illustrated in FIG. 9.

Referring to FIG. 10, a gate insulating layer 222 is depicted. In certain embodiments, the gate insulating layer 222 may be formed on the buffer layer 110 so as to cover the semiconductor layer 221. In certain embodiments, the gate insulating layer 222 may be formed as one or more inorganic insulating layers formed of Si oxide or Si nitride.

Referring to FIG. 11, a gate electrode 223 is depicted as formed on a portion of the gate insulating layer 222. In certain embodiments, the gate electrode 223 may be formed to correspond to a channel region 221a of the semiconductor layer 221, and an interlayer insulating layer 224 may be formed to cover the gate electrode 223.

Referring to FIG. 11, the semiconductor layer 221 is depicted as divided into channel, source, and drain regions 221a, 221b, and 221c. In certain embodiments, the channel, source, and drain regions 221a, 221b, and 221c may be formed by forming the gate electrode 223 and then doping an N or P type impurity on the source and drain regions 221b and 221c by using the gate electrode 223 as a self align mask, or may be formed by doping the impurity immediately after the semiconductor layer 221 is formed in FIG. 10.

Referring to FIG. 12, source and drain electrodes 225a and 225b are depicted as formed on the interlayer insulating layer 224 to respectively contact the source and drain regions 221b and 221c through contact holes, thereby completely manufacturing the TFT TR.

Referring to FIG. 13, a passivation layer 227 is depicted as formed on the interlayer insulating layer 224 so as to cover the TFT TR. In certain embodiments, the passivation layer 227 may be formed as one or more insulating layers and may have a planarized upper surface. In certain embodiments, the passivation layer 227 may be formed of an inorganic material and/or an organic material.

In certain embodiments, a via-hole may be formed through the passivation layer 227 so as to expose the drain electrode 225b of the TFT TR. In certain embodiments, a pixel electrode 310 may be formed in a predetermined pattern on the passivation layer 227 and may be electrically connected to the TFT TR through the via-hole.

In certain embodiments, a pixel defining layer 320 may be formed on the passivation layer 227 so as to cover edges of the pixel electrode 310 as depicted in FIG. 13. In certain embodiments, the pixel defining layer 320 covers the edges of the pixel electrode 310 to a predetermined thickness and defines a pixel. In certain embodiments, the pixel defining layer 320 prevents generation of electric arcs at ends of the pixel electrode 310 by increasing the distance between the ends of the pixel electrode 310 and a counter electrode 340 to be described below.

In certain embodiments, an organic layer 330 including an emission layer (EML) 331, and the counter electrode 340 may be sequentially formed on the pixel electrode 310.

In certain embodiments, the organic layer 330 may be a low-molecular or high-molecular organic layer. If a low-molecular organic layer is used, the organic layer 330 may have a structure in which one or more of the group consisting of a hole injection layer (HIL), a hole transporting layer (HTL), the EML 331, an electron transporting layer (ETL) and an electron injection layer (EIL) are stacked, and may be formed of various organic materials. In certain embodiments, the low-molecular organic layer may be formed of such as copper phthalocyanine (CuPc), N,N'-Di(naphthalene-1-yl)-N,N'-diphenyl-benzidine (NPB), and tris-8-hydroxyquinoline aluminum (Alq3).

If the high-molecular organic layer is used, the organic layer 330 may include only the EML 331 and the HTL in a direction toward the pixel electrode 310. In certain embodiments, the HTL may be formed of poly-(2,4)-ethylene-dihydroxy thiophene (PEDOT) or polyaniline (PANI). In certain embodiments, the EML 331 may be independently formed in each of red, green, and blue pixels, and the HIL, the HTL, the ETL, and the EIL may be commonly formed in red, green, and blue pixels as common layers.

Figure 14:
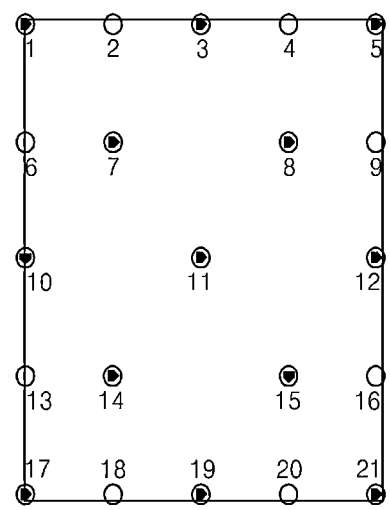
FIG. 14 is a diagram showing positions for capturing images of the poly-Si layer on a substrate illustrated in FIG. 9, in order to check crystallization states.
Figure 15:
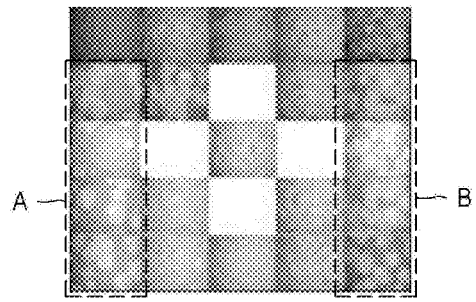
FIG. 15 shows images of the poly-Si layer illustrated in FIG. 9 when fluorine (F) is present.
Figure 16:
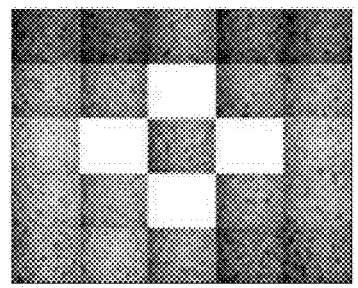
FIGS. 16 through 18 show images of the poly-Si layer illustrated in FIG. 9 after fluorine (F) is removed.
Figure 17:
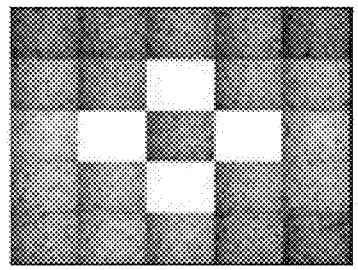
Figure 18:
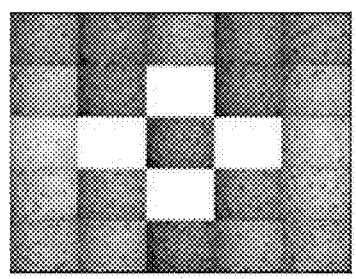

FIG. 14 is a diagram showing positions for capturing images of the poly-Si layer 220 on the substrate 100 illustrated in FIG. 9, in order to check crystallization states. FIG. 15 shows images of the poly-Si layer 220 illustrated in FIG. 9 when F exists. FIGS. 16 through 18 show images of the poly-Si layer 220 illustrated in FIG. 9 after F is removed.

Referring to FIG. 14, numbers in FIG. 14 indicate positions for capturing images of the poly-Si layer 220. In certain embodiments, numbers 1 to 5 indicate top positions from a left side to a right side of the substrate 100 in a width direction (X-axis direction) of the substrate 100. In certain embodiments, numbers 6 to 9 indicate upper positions from the left side to the right side of the substrate 100, which are spaced apart from the positions 1 to 5 in a length direction (Y-axis direction) of the substrate 100. In certain embodiments, numbers 10 to 12 indicate middle positions from the left side to the right side of the substrate 100, which are spaced apart from the positions 6 to 9 in the length direction (Y-axis direction) of the substrate 100, and 13 to 16 indicate lower positions from the left side to the right side of the substrate 100, which are spaced apart from the positions 10 to 12 in the length direction (Y-axis direction) of the substrate 100. In certain embodiments, numbers 17 to 21 indicate bottom positions from the left side to the right side of the substrate 100, which are spaced apart from the positions 13 to 16 in the length direction (Y-axis direction) of the substrate 100.

FIG. 15 shows images of the poly-Si layer 220 captured at the positions 1 to 21 illustrated in FIG. 14 when F is not removed. The images of FIG. 15 are captured when the chamber 1000 is cleaned at a process temperature of about 400° C. by using a $NF_3$ gas having a pressure of about 250 Pa.

Referring to FIG. 15, five top images are captured at the positions 1 to 5, and the remaining images are captured at the positions 6 to 21. The images show that crystallization is incomplete. In particular, portions A and B show that F is combined with metal and thus crystallization is incomplete.

In contrast, FIGS. 16 through 18 show images of the poly-Si layer 220 captured at the positions 1 to 21 illustrated in FIG. 14 when F is removed after the chamber 1000 is cleaned. The images of FIG. 16 are captured when the chamber 1000 is cleaned at a process temperature of about 400° C. by using a $NF_3$ gas having a pressure of about 250 Pa, and F is removed by processing the chamber 1000 with H plasma. A radio frequency (RF) power of the H plasma is about 0.3 kW to about 2 kW. If the chamber 1000 is cleaned by using the $NF_3$ gas and then is processed with the H plasma, H ions ($H^+$) are combined with F ions ($F^-$) remaining in the chamber 1000 so as to form H fluoride (HF). If the HF is removed by using a pump, the F ions may be prevented from being combined with metal for crystallization. As such, the crystallinity of the substrate 100 may be increased.

The images of FIG. 17 are captured when the chamber 1000 is cleaned at a process temperature of about 400° C. by using a $NF_3$ gas having a pressure of about 350 Pa. If the $NF_3$ gas having a high pressure is supplied into the chamber 1000, the flow of the $NF_3$ gas may be increased and thus the amount of F remaining in the chamber 1000 may be reduced. As such, the crystallinity of the substrate 100 may be increased.

The images of FIG. 18 are captured when the chamber 1000 is cleaned at a process temperature of about 400° C. by using a $NF_3$ gas having a pressure of about 250 Pa, and F is removed by performing an Ar purge operation and processing the chamber 1000 with H plasma. An RF power of the H plasma can be, for example, about 0.3 kW to about 2 kW. If the Ar purge operation is performed, a cycle of cleaning the chamber 1000 by using the $NF_3$ gas may be reduced and thus F remaining in the chamber 1000 may be reduced. After that, if the chamber 1000 is processed with the H plasma, H ions ($H^+$) are combined with F ions ($F^-$) remaining in the chamber 1000 so as to form HF. If the HF is removed by using a pump, the F ions may be prevented from being combined with metal for crystallization. As such, the crystallinity of the substrate 100 may be further increased.

An organic light emitting display apparatus is described above as a display apparatus including a TFT according to an aspect of the present embodiments, the TFT is not limited thereto and may be applied to all display apparatuses including a liquid crystal display apparatus.

According to one or more of the embodiments, by removing F in a chamber, inhibition of crystallization of a-Si due to F may be prevented and thus a uniform poly-Si layer may be formed.

Although exemplary embodiments have been described for illustrative purposes, those skilled in the art will appreciate that various modifications, additions and substitutions are possible without departing from the spirit and scope of the present embodiments as defined by the following claims. The exemplary embodiments should be considered in a descriptive sense only and not for purposes of limitation. Therefore, the scope of the present embodiments is defined not by the detailed description but by the following claims, and all differences within the scope will be construed as being included in the present embodiments.

What is claimed is:

1. A method of forming a polysilicon (poly-Si) layer, the method comprising:
    forming an amorphous silicon (a-Si) layer on a substrate in a chamber;
    cleaning the chamber;
    removing fluorine (F) generated while cleaning the chamber;
    forming a metal catalyst layer on the a-Si layer; and
    crystallizing the a-Si layer into a poly-Si layer by performing a thermal processing operation.

2. The method of claim 1, wherein cleaning the chamber comprises supplying a F-based cleaning gas into the chamber.

3. The method of claim 2, wherein the F-based cleaning gas is a $NF_3$ gas.

4. The method of claim 1, wherein removing F comprises processing the chamber with hydrogen (H) plasma after cleaning the chamber.

5. The method of claim 1, wherein removing F comprises processing a surface of the a-Si layer with H plasma after cleaning the chamber.

6. The method of claim 1, further comprising purging a residual gas or a by-product from the chamber by using an argon (Ar) gas after forming the a-Si layer.

7. The method of claim 1, further comprising forming a buffer layer on the substrate before forming the a-Si layer.

8. The method of claim 7, further comprising cleaning the chamber by supplying an F-based cleaning gas into the chamber after forming the buffer layer.

9. The method of claim 8, wherein the F-based cleaning gas is a $NF_3$ gas.

10. The method of claim 8, further comprising removing F generated while cleaning the chamber after cleaning the chamber and before forming the a-Si layer.

11. The method of claim 10, wherein the removing of F comprises removing F by processing the chamber with H plasma after cleaning the chamber.

12. The method of claim 10, wherein the removing of F comprises removing F by processing a surface of the buffer layer with H plasma after cleaning the chamber.

13. The method of claim 10, further comprising purging a residual gas or a by-product from the chamber by using an Ar gas after forming the buffer layer.

14. The method of claim 7, wherein the buffer layer comprises silicon (Si) oxide, Si nitride, or Si oxynitride.

15. The method of claim 1, wherein the metal catalyst layer is selected from the group consisting of nickel (Ni), palladium (Pd), titanium (Ti), silver (Ag), aluminum (Al), tin (Sn), antimony (Sb), copper (Cu), cobalt (Co), molybdenum (Mo), terbium (Tb), ruthenium (Ru), rhodium (Rh), cadmium (Cd), and platinum (Pt).

16. The method of claim 1, wherein the forming of the metal catalyst layer comprises:
    forming a capping layer on the a-Si layer; and
    forming the metal catalyst layer on the capping layer.

17. The method of claim 1, wherein the forming of the metal catalyst layer comprises:
    forming a thermal oxidation layer on the a-Si layer; and
    forming the metal catalyst layer on the thermal oxidation layer.

18. A method of manufacturing a thin film transistor (TFT), the method comprising:
    forming an amorphous silicon (a-Si) layer on a substrate in a chamber;
    cleaning the chamber;
    removing fluorine (F) generated while cleaning the chamber;
    forming a metal catalyst layer on the a-Si layer;
    crystallizing the a-Si layer into a polysilicon (poly-Si) layer by performing a thermal processing operation;
    patterning the poly-Si layer into a semiconductor layer having a predetermined shape;
    forming a gate insulating layer to cover the semiconductor layer;
    forming a gate electrode on the gate insulating layer so as to correspond to a channel region of the semiconductor layer;
    forming an interlayer insulating layer on the gate insulating layer so as to cover the gate electrode; and
    forming source and drain electrodes on the interlayer insulating layer so as to be respectively electrically connected to source and drain regions of the semiconductor layer.

19. The method of claim 18, wherein cleaning the chamber comprises supplying a F-based cleaning gas into the chamber.

20. The method of claim 19, wherein the F-based cleaning gas is a $NF_3$ gas.

21. The method of claim 18, wherein removing F comprises removing F by processing the chamber with hydrogen (H) plasma, after cleaning the chamber.

22. The method of claim 18, wherein removing F comprises removing F by processing a surface of the a-Si layer with H plasma after cleaning the chamber.

23. The method of claim 18, further comprising purging a residual gas or a by-product from the chamber by using an argon (Ar) gas after forming the a-Si layer.

24. The method of claim 18, further comprising forming a buffer layer on the substrate before forming the a-Si layer.

25. The method of claim 24, further comprising cleaning the chamber by supplying an F-based cleaning gas into the chamber after forming the buffer layer.

26. The method of claim 25, wherein the F-based cleaning gas is a $NF_3$ gas.

27. The method of claim 25, further comprising removing F generated while cleaning the chamber after cleaning the chamber and before forming the a-Si layer.

28. The method of claim 27, wherein removing F comprises removing F by processing the chamber with H plasma after cleaning the chamber.

29. The method of claim 27, wherein removing F comprises removing F by processing a surface of the buffer layer with H plasma after cleaning the chamber.

30. The method of claim 27, further comprising purging a residual gas or a by-product from the chamber by using an Ar gas after forming the buffer layer.

31. The method of claim 24, wherein the buffer layer comprises silicon (Si) oxide, Si nitride, or Si oxynitride.

32. The method of claim 18, wherein the metal catalyst layer is selected from the group consisting of nickel (Ni), palladium (Pd), titanium (Ti), silver (Ag), aluminum (Al), tin (Sn), antimony (Sb), copper (Cu), cobalt (Co), molybdenum (Mo), terbium (Tb), ruthenium (Ru), rhodium (Rh), cadmium (Cd), and platinum (Pt).

33. The method of claim 18, wherein forming the metal catalyst layer comprises:

forming a capping layer on the a-Si layer; and forming the metal catalyst layer on the capping layer.

34. The method of claim 18, wherein forming the metal catalyst layer comprises:

forming a thermal oxidation layer on the a-Si layer; and forming the metal catalyst layer on the thermal oxidation layer.

* * * * *